US009121967B2

(12) United States Patent
Le et al.

(10) Patent No.: US 9,121,967 B2
(45) Date of Patent: Sep. 1, 2015

(54) METHOD AND APPARATUS FOR WELL-BORE PROXIMITY MEASUREMENT WHILE DRILLING

(71) Applicant: BAKER HUGHES INCORPORATED, Houston, TX (US)

(72) Inventors: Fei Le, Houston, TX (US); Arcady Reiderman, Houston, TX (US)

(73) Assignee: Baker Hughes Incorporated, Houston, TX (US)

( * ) Notice: Subject to any disclaimer, the term of this patent is extended or adjusted under 35 U.S.C. 154(b) by 338 days.

(21) Appl. No.: 13/658,599

(22) Filed: Oct. 23, 2012

(65) Prior Publication Data
US 2013/0057287 A1    Mar. 7, 2013

Related U.S. Application Data

(63) Continuation-in-part of application No. 11/848,333, filed on Aug. 31, 2007, now Pat. No. 8,294,468.

(51) Int. Cl.
G01V 3/10 (2006.01)
G01V 3/32 (2006.01)
G01R 33/38 (2006.01)
E21B 47/09 (2012.01)

(52) U.S. Cl.
CPC .............. G01V 3/32 (2013.01); E21B 47/0905 (2013.01); G01R 33/3808 (2013.01)

(58) Field of Classification Search
CPC ... G01V 3/32; E21B 47/0905; G01R 33/3808
See application file for complete search history.

(56) References Cited

U.S. PATENT DOCUMENTS

| 3,440,523 A | 4/1969 | Gabillard |
| 3,453,530 A | 7/1969 | Attali |
| 3,561,007 A | 2/1971 | Gouilloud et al. |
| 3,731,752 A | 5/1973 | Schad |
| 4,205,288 A | 5/1980 | Lin et al. |
| 4,323,848 A | 4/1982 | Kuckes |
| 4,372,398 A | 2/1983 | Kuckes |
| 4,397,185 A | 8/1983 | Craig et al. |
| 4,409,846 A | 10/1983 | Ueno |
| 4,443,762 A | 4/1984 | Kuckes |
| 4,465,140 A | 8/1984 | Hoehn, Jr. |
| 4,529,939 A | 7/1985 | Kuckes |

(Continued)

OTHER PUBLICATIONS

Nekut, A. G., et al.; "8th One Day Conference on Horizontal Well Technology," Canadian Sections SPE / Petroleum Society, Nov. 7, 2001, pp. 1-8.

(Continued)

Primary Examiner — Jermele M Hollington
(74) Attorney, Agent, or Firm — Cantor Colburn LLP

(57) ABSTRACT

An apparatus for determining a distance between a first borehole and a second borehole is provided that in one embodiment includes a rotating magnet on a tool configured for placement in the second borehole for inducing magnetization in a magnetic object in the first borehole, a first coil and a second coil placed radially symmetrically with respect to an axis of the tool, the first coil providing a first signal and second coil providing a second signal responsive to a magnetic flux resulting from the magnetization in the magnetic object in the first borehole, and a controller configured to combine the first signal and the second signal and determining distance between the first borehole and the second borehole using the combined signal.

21 Claims, 11 Drawing Sheets

(56) References Cited

U.S. PATENT DOCUMENTS

| | | |
|---|---|---|
| 4,647,853 A | 3/1987 | Cobern |
| 4,700,142 A | 10/1987 | Kuckes |
| 4,736,634 A | 4/1988 | Amata |
| 4,791,373 A | 12/1988 | Kuckes |
| 4,845,434 A | 7/1989 | Kuckes et al. |
| 4,933,640 A | 6/1990 | Kuckes |
| 5,074,365 A | 12/1991 | Kuckes |
| 5,084,678 A | 1/1992 | Hutin |
| 5,086,554 A | 2/1992 | Murata et al. |
| 5,218,301 A | 6/1993 | Kuckes |
| 5,258,755 A | 11/1993 | Kuckes |
| 5,280,243 A | 1/1994 | Miller |
| 5,305,212 A | 4/1994 | Kuckes |
| 5,343,152 A | 8/1994 | Kuckes |
| 5,485,089 A | 1/1996 | Kuckes |
| 5,512,830 A | 4/1996 | Kuckes |
| 5,513,710 A | 5/1996 | Kuckes |
| 5,515,931 A | 5/1996 | Kuckes |
| 5,582,248 A | 12/1996 | Estes |
| 5,589,775 A | 12/1996 | Kuckes |
| 5,657,826 A | 8/1997 | Kuckes |
| 5,675,488 A | 10/1997 | McElhinney |
| 5,725,059 A | 3/1998 | Kuckes et al. |
| 5,923,170 A | 7/1999 | Kuckes |
| 6,267,185 B1 | 7/2001 | Mougel et al. |
| 6,791,331 B2 | 9/2004 | Conti |
| 6,927,577 B2 | 8/2005 | Nelson |
| 6,937,023 B2 | 8/2005 | McElhinney |
| 6,985,814 B2 | 1/2006 | McElhinney |
| 7,046,009 B2 | 5/2006 | Itskovich |
| 7,568,532 B2 | 8/2009 | Kuckes et al. |
| 8,294,468 B2 | 10/2012 | Reiderman |
| 8,471,562 B2 | 6/2013 | Knizhnik |
| 2003/0076107 A1 | 4/2003 | Fanini et al. |
| 2003/0129763 A1 | 7/2003 | Chamberlain et al. |
| 2004/0183538 A1 | 9/2004 | Hanstein et al. |
| 2005/0030021 A1 | 2/2005 | Prammer et al. |
| 2005/0189945 A1 | 9/2005 | Reiderman |
| 2005/0247484 A1 | 11/2005 | Brune et al. |
| 2007/0278008 A1 | 12/2007 | Kuckes et al. |
| 2008/0018334 A1 | 1/2008 | Reiderman |
| 2008/0041626 A1 | 2/2008 | Clark |
| 2009/0260879 A1 | 10/2009 | Clark et al. |
| 2014/0111210 A1* | 4/2014 | Fang et al. .............. 324/346 |

OTHER PUBLICATIONS

International Search Report and the Written Opinion dated Jan. 27, 2014 for International Application No. PCT/US2013/065572.

* cited by examiner

METHOD AND APPARATUS FOR WELL-BORE PROXIMITY MEASUREMENT WHILE DRILLING

CROSS-REFERENCE TO RELATED APPLICATION

This application is a continuation-in-part of U.S. patent application Ser. No. 11/848,333, filed Aug. 31, 2007, now U.S. Pat. No. 8,294,468, issued Oct. 23, 2012, which is incorporated herein by reference in its entirety.

BACKGROUND OF THE DISCLOSURE

1. Field of the Disclosure

This disclosure relates generally to apparatus and methods for determining a distance to a pre-existing wellbore and controlling drilling operations based on the determination.

2. Background of the Art

In the process of drilling wells for hydrocarbon production, it is commonly necessary to drill a second well in a predetermined relationship to an existing well. An example of this may be when a blowout occurred in the existing well; two approaches may be taken to control the blowout. One method is to use explosives at the surface and snuff out the fire in the burning well. This procedure is fraught with danger and requires prompt control of hydrocarbons flow in the well. The second method is to drill a second borehole to intersect the blowout well and pump drilling mud into the blowout well. This is not a trivial matter. An error of half a degree can result in a deviation of close to 90 feet at a depth of 10,000 feet. A typical borehole is about 12 inches in diameter, a miniscule target compared to the potential error zone.

Another situation in which accurate drilling is required is in secondary recovery operations. For various reasons, such as low formation pressure or high viscosity of hydrocarbons in the reservoir, production under natural conditions of hydrocarbons may be at uneconomically low rates. In such cases, a second borehole is drilled to be substantially parallel to the pre-existing borehole. Fluid such as water, $CO_2$ is then injected into the formation from the second borehole and the injected fluid drives the hydrocarbons in the formation towards the producing borehole where it may be recovered.

In 1970, Shell Oil Co.'s Cox 1, a 22,000-ft Smackover exploratory well, blew out near Piney Woods, Miss. This challenge led to the first direct intersection of a blowout tubular using an acoustic detection method. Wireline instruments were developed to detect proximity of a tubular by measuring distance and direction from the relief well to the blowout casing using the noise from the flowing gas in the blowout well. More recently, electromagnetic methods have been used to determine the distance to the cased preexisting well.

The electromagnetic techniques fall into two (2) categories. In the first category, referred to as active ranging, a source of AC magnetic field and a magnetic sensor are placed in different wells. The source can be a solenoid placed in the production well or an electric current injected in the production well casing. The magnetic field produced by the current in the casing is measured in the drilling well. The active ranging approach can probably offer a good accuracy of measurements, but suffers from the drawback that access to the pre-existing well is required.

In the second category are passive ranging techniques that do not require access to the pre-existing well while drilling the second well. The techniques normally utilize a relatively strong magnetism induced in the casing of the pre-existing well by the Earth's magnetic field. The signal due directly to the earth's magnetic field is a problem, limiting the accuracy of this measurement. Residual magnetism of the casing introduces additional uncertainties.

The present disclosure discloses apparatus and methods for determining distance from a pre-existing wellbore in which access to the pre-existing well is not required and the effects of the direct earth's magnetic field are minimized.

SUMMARY

One embodiment of the disclosure is a method of determining a distance to a first borehole from a second borehole. A time varying magnetic field is produced in the first borehole using a magnet in the second borehole. Magnetization in a magnetic object in the first borehole is produced. A coil in the second borehole is used to produce a signal responsive to a magnetic flux resulting from the magnetization. This signal is used to estimate the distance. The magnetic object in the first borehole may be a casing. The method may further include using the estimated distance to maintain a trajectory of the second borehole in a desired relation to the first borehole. The desired relation may be substantially parallel or intersecting. The method may include conveying a magnet on a bottomhole assembly on a drilling tubular into the second borehole. Producing a time varying field may be done rotating a magnet having a substantially transverse magnetization in the second borehole at a first rotational speed, and producing the signal may be done by rotating the coil synchronously with the magnet. Estimating the distance may further include filtering of the signal to remove an effect of a magnetic field of the earth. The method may further include measuring the first rotational speed, determining a second harmonic component of the first rotational speed, and using the determined second harmonic component to correct the signal. The method may further include measuring an additional signal using a split coil responsive to the magnetic flux, and using the additional signal as an indicator of an inclination between an axis of the first borehole and an axis of the second borehole. The first rotational speed may be substantially the same as a rotational speed of a bottomhole assembly. The time varying field may be produced by switching a polarity of a magnet having a substantially longitudinal magnetization in the second borehole, and producing the signal may be done using a coil with an axis that is substantially longitudinal.

Another embodiment of the disclosure is an apparatus for determining a distance in a first borehole from a second borehole. The apparatus includes a magnet configured to be conveyed in a second borehole and produce a time varying magnetic field and induce a magnetization in a magnetic object in the first borehole. A coil in the second borehole is configured to produce a signal responsive to a magnetic flux resulting from the magnetization. A processor is configured estimate the distance using the signal. The magnetic object in the first borehole may be a casing. The processor may be further configured to use the estimated distance to maintain a trajectory of the second borehole in a desired relation to a trajectory of the first borehole. The desired relation may be substantially parallel and/or intersecting. The apparatus may further include a bottomhole assembly on a drilling tubular configured to convey the magnet into the second borehole. The magnet may be rotating magnet having a substantially transverse magnetization configured to rotate at a first rotational speed, and the coil is configured to rotate synchronously with the magnet. The processor may be further configured to determine the distance by further filtering the signal to remove an effect of a magnetic field of the earth. The apparatus may further include an accelerometer configured to measure the first rotational speed, and the processor may be further configured to determine a second harmonic component of the first rotational speed and use the determined second harmonic component to correct the signal. The apparatus may further include a split coil responsive to the magnetic flux configured to produce an additional signal and the processor may be further configured to use the additional signal as an indicator of an inclination between an axis of the first borehole and an axis of the second borehole. The first rotational speed may be substantially the same as a rotational speed of a bottomhole assembly. The apparatus may include a switchable magnet having a substantially longitudinal magnetization in the second borehole configured to be switched and produce the time varying field, and a coil with an axis that is substantially longitudinal configured to produce the signal. The processor may be further configured to estimate the distance using a portion of the signal substantially excluding a component of the signal due to a direct coupling of the magnet and coil, and substantially excluding a component of the signal due to eddy currents in the formation and a conductive body in the second borehole.

Another embodiment discloses an apparatus for determining a distance between a first borehole and a second borehole is provided that in one embodiment includes a rotating magnet on a tool configured for placement in the second borehole for inducing magnetization in a magnetic object in the first borehole, a first coil and a second coil placed radially symmetrically with respect to an axis of the tool, the first coil providing a first signal and second coil providing a second signal responsive to a magnetic flux resulting from the magnetization in the magnetic object in the first borehole, and a controller configured to combine the first signal and the second signal and determining distance between the first borehole and the second borehole using the combined signal.

Another embodiment of the disclosure provides a method for determining distance between a first borehole and a second borehole that includes the aspects of An apparatus for determining a distance between a first borehole and a second borehole is provided that in one embodiment includes a rotating magnet on a tool configured for placement in the second borehole for inducing magnetization in a magnetic object in the first borehole, a first coil and a second coil placed radially symmetrically with respect to an axis of the tool, the first coil providing a first signal and second coil providing a second signal responsive to a magnetic flux resulting from the magnetization in the magnetic object in the first borehole, and a controller configured to combine the first signal and the second signal and determining distance between the first borehole and the second borehole using the combined signal.

Another embodiment of the disclosure is a computer-readable medium for use with an apparatus for determining a distance to a first borehole from a second borehole. The apparatus includes a magnet configured to be conveyed in a second borehole, produce a time varying magnetic field in the first borehole, and induce a magnetization in a magnetic object in the first borehole. The apparatus also includes a coil in the second borehole configured to produce a signal responding to a magnetic flux resulting from the magnetization. The medium includes instructions which enable a processor to estimate the distance using the signal. The medium may include a ROM, an EPROM, an EEPROM, a flash memory, and/or an optical disk.

BRIEF DESCRIPTION OF THE FIGURES

For detailed understanding of the present disclosure, references should be made to the following detailed description of the preferred embodiment, taken in conjunction with the accompanying drawings, in which like elements have been given like numerals and wherein.

DETAILED DESCRIPTION OF THE DISCLOSURE

Figure 1:
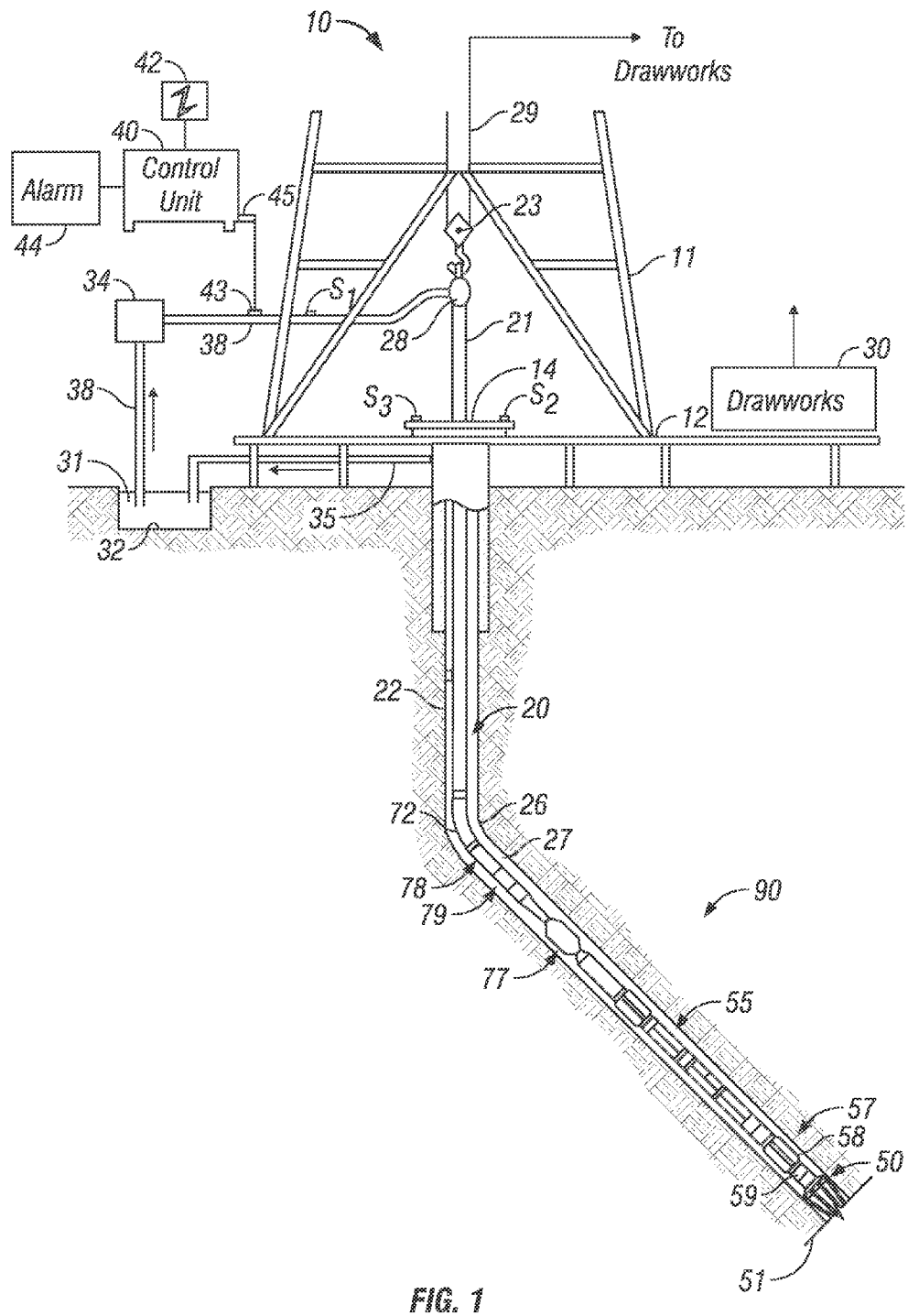
FIG. 1 is a schematic illustration of a drilling system suitable for use with the present disclosure.

FIG. 1 shows a schematic diagram of a drilling system 10 with a drillstring 20 carrying a drilling assembly 90 (also referred to as the bottom hole assembly, or ABHA≅) conveyed in a "wellbore" or "borehole" 26 for drilling the wellbore. The drilling system 10 includes a conventional derrick 11 erected on a floor 12 which supports a rotary table 14 that is rotated by a prime mover such as an electric motor (not shown) at a desired rotational speed. The drillstring 20 includes a tubing such as a drill pipe 22 or a coiled-tubing extending downward from the surface into the borehole 26. The drillstring 20 is pushed into the wellbore 26 when a drill pipe 22 is used as the tubing. For coiled-tubing applications, a tubing injector, such as an injector (not shown), however, is used to move the tubing from a source thereof, such as a reel (not shown), to the wellbore 26. The drill bit 50 attached to the end of the drillstring breaks up the geological formations when it is rotated to drill the borehole 26. If a drill pipe 22 is used, the drillstring 20 is coupled to a drawworks 30 via a Kelly joint 21, swivel, 28 and line 29 through a pulley 23. During drilling operations, the drawworks 30 is operated to control the weight on bit, which is an important parameter that affects the rate of penetration. The operation of the drawworks is well known in the art and is thus not described in detail herein.

During drilling operations, a suitable drilling fluid 31 from a mud pit (source) 32 is circulated under pressure through a channel in the drillstring 20 by a mud pump 34. The drilling fluid passes from the mud pump 34 into the drillstring 20 via a desurger 36, fluid line 28 and Kelly joint 21. The drilling fluid 31 is discharged at the borehole bottom 51 through an opening in the drill bit 50. The drilling fluid 31 circulates uphole through the annular space 27 between the drillstring 20 and the borehole 26 and returns to the mud pit 32 via a return line 35. The drilling fluid acts to lubricate the drill bit 50 and to carry borehole cutting or chips away from the drill bit 50. A sensor $S_1$ preferably placed in the line 38 provides information about the fluid flow rate. A surface torque sensor $S_2$ and a sensor $S_3$ associated with the drillstring 20 respectively provide information about the torque and rotational speed of the drillstring. Additionally, a sensor (not shown) associated with line 29 is used to provide the hook load of the drillstring 20.

In one embodiment of the disclosure, the drill bit 50 is rotated by only rotating the drill pipe 22. In another embodiment of the disclosure, a downhole motor 55 (mud motor) is disposed in the drilling assembly 90 to rotate the drill bit 50 and the drill pipe 22 is rotated usually to supplement the rotational power, if required, and to effect changes in the drilling direction.

In the embodiment of FIG. 1, the mud motor 55 is coupled to the drill bit 50 via a drive shaft (not shown) disposed in a bearing assembly 57. The mud motor rotates the drill bit 50 when the drilling fluid 31 passes through the mud motor 55 under pressure. The bearing assembly 57 supports the radial and axial forces of the drill bit. A stabilizer 58 coupled to the bearing assembly 57 acts as a centralizer for the lowermost portion of the mud motor assembly.

In one embodiment of the disclosure, a drilling sensor module 59 is placed near the drill bit 50. The drilling sensor module contains sensors, circuitry and processing software and algorithms relating to the dynamic drilling parameters. Such parameters preferably include bit bounce, stick-slip of the drilling assembly, backward rotation, torque, shocks, borehole and annulus pressure, acceleration measurements and other measurements of the drill bit condition. A suitable telemetry or communication sub 72 using, for example, two-way telemetry, is also provided as illustrated in the drilling assembly 100. The drilling sensor module processes the sensor information and transmits it to the surface control unit 40 via the telemetry system 72.

The communication sub 72, a power unit 78 and an MWD tool 79 are all connected in tandem with the drillstring 20. Flex subs, for example, are used in connecting the MWD tool 79 in the drilling assembly 90. Such subs and tools form the bottom hole drilling assembly 90 between the drillstring 20 and the drill bit 50. The drilling assembly 90 makes various measurements including the pulsed nuclear magnetic resonance measurements while the borehole 26 is being drilled. The communication sub 72 obtains the signals and measurements and transfers the signals, using two-way telemetry, for example, to be processed on the surface. Alternatively, the signals can be processed using a downhole processor in the drilling assembly 90.

The surface control unit or processor 40 also receives signals from other downhole sensors and devices and signals from sensors $S_1$-$S_3$ and other sensors used in the system 10 and processes such signals according to programmed instructions provided to the surface control unit 40. The surface control unit 40 displays desired drilling parameters and other information on a display/monitor 42 utilized by an operator to control the drilling operations. The surface control unit 40 preferably includes a computer or a microprocessor-based processing system, memory for storing programs or models and data, a recorder for recording data, and other peripherals. The control unit 40 is preferably adapted to activate alarms 44 when certain unsafe or undesirable operating conditions occur. The system also includes a downhole processor, sensor assembly for making formation evaluation and an orientation sensor. These may be located at any suitable position on the bottomhole assembly (BHA).

Figure 2:
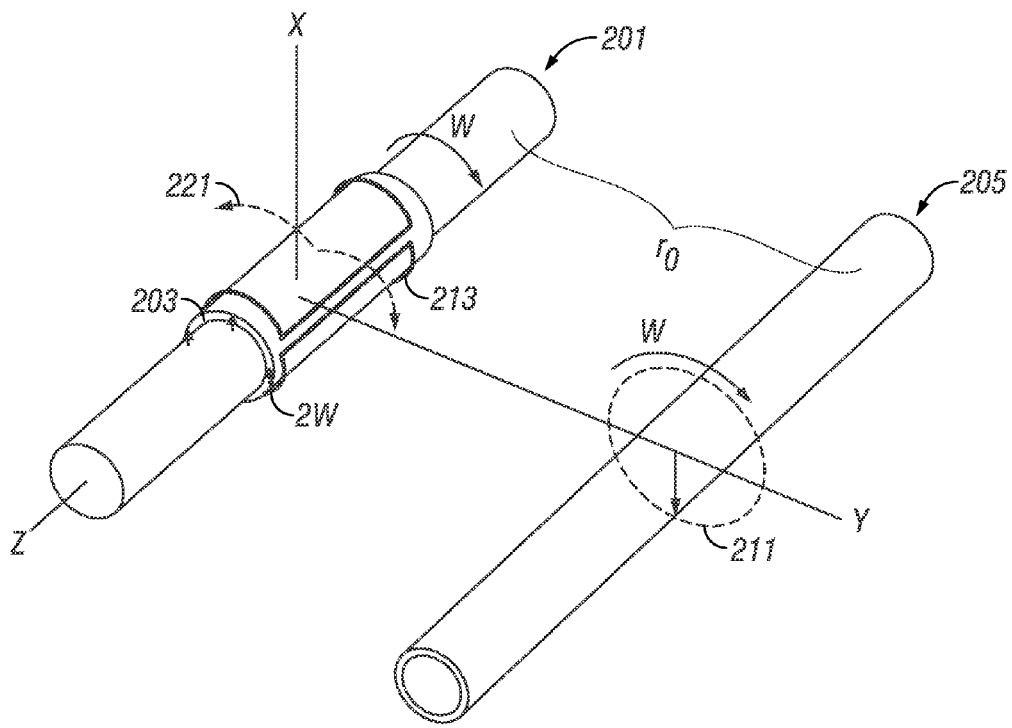
FIG. 2 shows a simplified layout of the magnetometer and the coordinate system used for the calculations.

Turning now to FIG. 2, a permanent magnet 203 is shown on a drill collar section 201 of the secondary well. The magnet is transversely magnetized with the flux direction indicated by 221. The pre-existing well casing is denoted by 205. The coordinate axes x, y, and z are as indicated in FIG. 2. The collar section is provided with a coil 213. The coil rotates synchronously with the magnet, but the magnet-coil combination need not be synchronous with the rotation of the drill collar: this may be done by having the magnet-coil combination on a sleeve. The rotating magnet generates a variable magnetic field at a magnetic object such as the casing 205 of the pre-existing well. This variable magnetic field induces magnetization in the casing that, in turn, generate a variable magnetic flux picked up by the rotating coil 213.

The magnetic field generated by the magnet at the target well position can be approximated by the point dipole formula:

$$\vec{H}_{MAGNET} = \frac{1}{4\pi}\left[\frac{3(\vec{p}_m \cdot \vec{r})}{r^5} - \frac{\vec{p}_m}{r^3}\right], \quad (1)$$

Where $\vec{p}_m$ is the dipole moment of the magnet, and $\vec{r}$ is the distance from the magnet center to a point on the casing 205. When the magnet 203 rotates in the XY plane with angular velocity ω, then $$\vec{p}_m = p_m[\cos(\omega t)\vec{e}_x + \sin(\omega t)\vec{e}_y] \quad (2),$$

where $\vec{e}_x$ and $\vec{e}_y$ are unit vectors in the x- and y-directions respectively. The rotating coil sensitivity function (magnetic field produced by the coil driven with a unit current) can be written as:

$$\vec{S}_{COIL} = \frac{A_{COIL}}{p_m} \cdot \vec{H}_{MAGNET}. \quad (3)$$

Here $\vec{S}_{COIL}$ is the sensitivity function of the coil and $A_{COIL}$ is the effective area of the coil.

The rotating magnet generates variable magnetization in the casing. The magnetization induces a variable magnetic flux in the coil. Based on the principle of reciprocity, the corresponding voltage can be expressed as:

$$V_{COIL} = \mu_0 \frac{d}{dt}\left[\int_{CASING\ VOLUME} \vec{M}_{CASING}(\vec{r}, t) \cdot \vec{S}_{COIL}(\vec{r}, t) dv\right], \quad (4)$$

where $\vec{M}_{CASING}$ is the magnetization of the casing, and $\vec{S}_{COIL}$ is the coil sensitivity function.

In eqn. (4) the sensitivity $\vec{S}_{COIL}$ can be considered as a slowly varying function over the cross-sectional area of the casing. Therefore, we can introduce a magnetization average over the cross-sectional area of the casing as:

$$\langle \vec{M}_{CASING} \rangle = \frac{1}{A_{CASING}} \cdot \int_{CROSS\_SECTION} \vec{M}_{CASING}(\vec{r}, t)ds \approx \qquad (5)$$
$$\chi_{\it{eff\_xy}} \cdot \vec{H}_{MAGNET\_XY}(\vec{r}_a, t) + \chi_{\it{eff\_z}} \cdot \vec{H}_{MAGNET\_Z}(\vec{r}_a, t),$$

Where $\chi_{\it{eff\_xy}}$ and $\chi_{\it{eff\_z}}$ are the effective magnetic susceptibilities in the direction perpendicular and parallel to the casing axis respectively, $A_{CASING}$ is the effective area of the casing, and $\vec{r}_a$ represents points along the axis of the casing. Due to the shape of the casing we can use the following simlification: $\chi_{\it{eff\_xy}} \ll \chi_{\it{eff\_z}}$. This then gives, for the coil voltage, the equation:

$$V_{COIL} = \mu_0 \cdot \chi_{\it{eff\_z}} \cdot A_{CASING} \cdot \frac{A_{COIL}}{p_m} \cdot \frac{d}{dt} \qquad (6)$$
$$\left( \int_{CASING\_LENGTH} |H_{MAGNET\_z}(\vec{r}_a, t)|^2 dr_a \right).$$

This then gives the approximate result $$V_{COIL} = \frac{3\mu_0 \cdot \chi_{\it{eff\_z}} \cdot A_{CASING} \cdot A_{COIL} \cdot p_m \cdot \omega}{64\pi^2 \cdot r_0^5} \cdot \cos(2\omega \cdot t). \qquad (7)$$

Here $A_{CASING}$ is the cross-sectional area of the casing.

For practical values $\chi_{\it{eff\_z}}=100$, $A_{CASING}=2\pi \cdot 10^{-3}$ m², $\omega=2\pi\ 5\ s^{-1}$, $A_{COIL}=0.2 \cdot 200$ m², $p_m=1000$ A·m², and separation between wells $r_0=10$ m, the estimated voltage amplitude $V_m=48$ nV. In case the thermal noise in the coil and the preamplifier noise are the only sources of noise the signal-to-noise ratio per 1 second measurement time can be expected to be around 20. If $r_0=5$ m, then $V_m=0.75$ µV.

It is important to note from eqn. (7) that the voltage induced in the rotating coil by the rotating magnetization of the casing has a frequency which is twice the rotation frequency of the magnet/coil assembly. This means that the measured proximity signal is relatively easy to separate from a parasitic signal induced in the rotating coil due to the earth's magnetic field. The parasitic signal has a frequency equal to the magnet/coil rotation frequency.

The main sources of error in the measurement technique is due to the presence of some second harmonic in the magnet/coil assembly rotation. In this case the earth's magnetic field related signal would appear at the frequency 2ω thus giving a spurious signal at the same frequency as the expected proximity signal. Fortunately, the presence of 2ω-component in the rotation speed can be assessed with an accelerometer and then the data can be used for eliminating the spurious signal from the measurement results. The second harmonic signal is easy to calculate from the accelerometer output, known value and direction of the earth's magnetic field, and measurements of borehole inclination and azimuth. A gyro survey may be needed to get the borehole inclination and azimuth.

Figure 3:
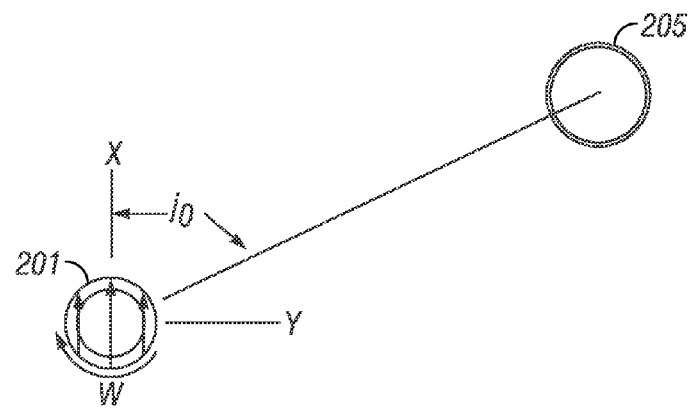
FIG. 3 illustrates azimuthal dependence of the signal in the sensor coil.

FIG. 3 illustrates azimuthal dependence of the voltage on the rotating coil 213. Using reference voltage $$V_{REF} \propto \cos(2\omega \cdot t), \qquad (8)$$

synchronized with the magnet/coil rotation, the following expression for the voltage on the coil 213 can be written $$V_{REF} = V_m \cdot \cos[2(\omega \cdot t + \phi_0)]. \qquad (9)$$

Here $\phi_0$ is the azimuth of the casing with respect to the secondary well.

Thus the phase of the signal on the coil 213 is sensitive to the azimuthal position of the casing 205 with respect to the secondary well 201.

Figure 4:
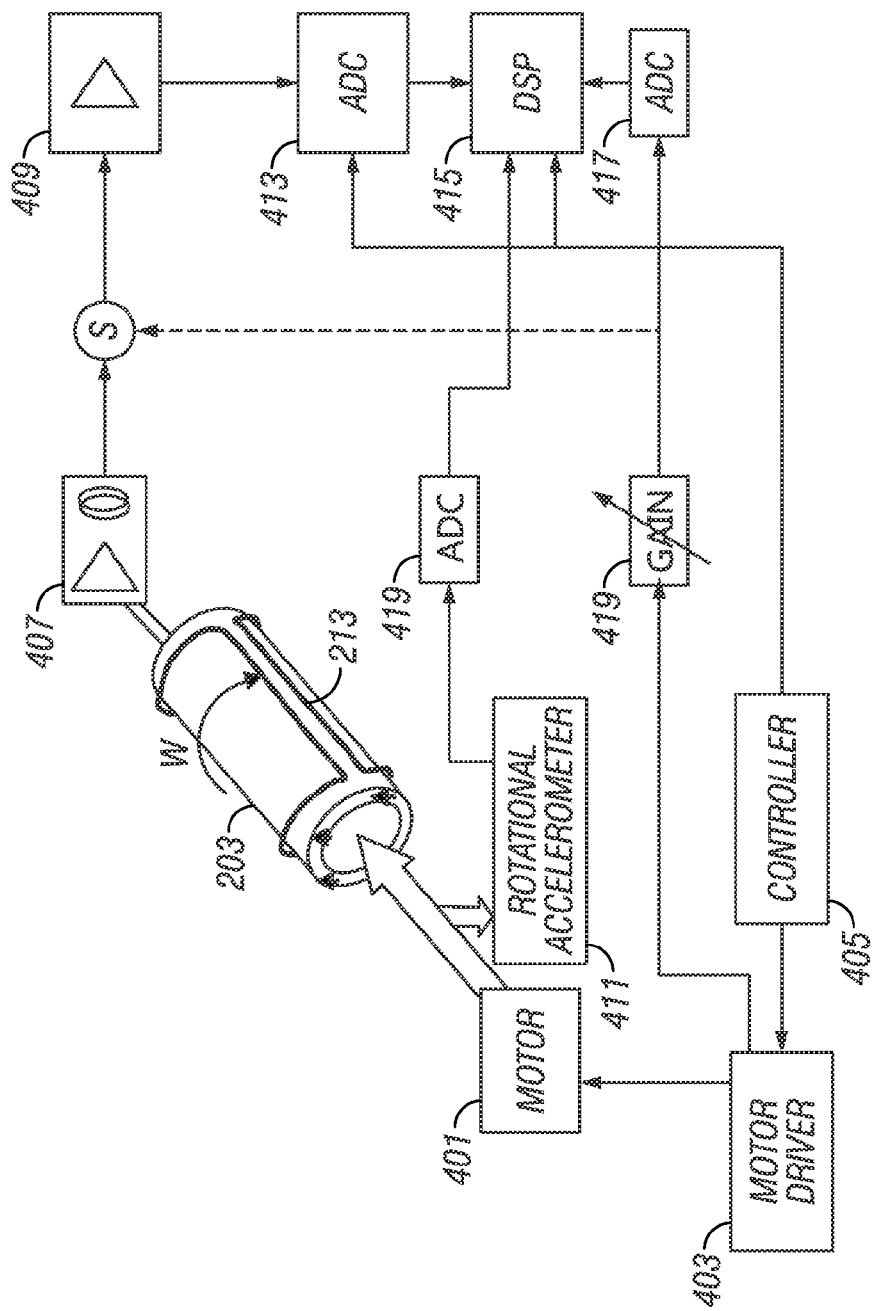
FIG. 4 is a schematic illustration of implementation of the rotational magnetometer.

FIG. 4 is a block diagram illustrating an implementation of the rotational magnetometer. The magnetometer comprises a motor 401 rotating the magnet 203 and the coil 213. The signal from the coil 213 transferred to the low noise preamplifier 409 via an adapter (e. g. sliding rings) 407. Provision is made to eliminate parasitic signal 2ω generated by the Earth's magnetic field in presence of rotational disturbances: the signals from rotational accelerometer 411 and the motor driver 403 are used to eliminate parasitic signals from the measurement data. Serving this purpose are also a controller 405, analog-to-digital converters 413, 417, 419, digital signal processor 415 and a variable gain amplifier 419.

Those versed in the art and having benefit of the present disclosure would recognize that it is sufficient for the coil 213 to be able to responsive to a component of the magnetic flux due to the induced magnetization that is transverse to the z-axis. The configuration of the coil 213 shown in FIG. 2 is not the only arrangement that would provide a suitable signal, but it is one of the better designs. In principle, an inclined planar coil on the BHA with the coil axis inclined to the z-axis would work. For a coil placed on the magnet 201 the signal would be greatest when the coil axis is transverse to the z-axis. Similarly, the magnet does not have to be a transversally magnetized cylindrical magnet as indicated by 201. The method would also work, albeit less efficiently, using a bar magnet with its magnetization direction having a component parallel to the z-axis. Those versed in the art and having benefit of the present disclosure would recognize also that a longitudinal coil spaced axially apart from the magnet 201 can be used to receive proximity signal originating from variable Z-component of the magnetization of the casing.

Figure 5:
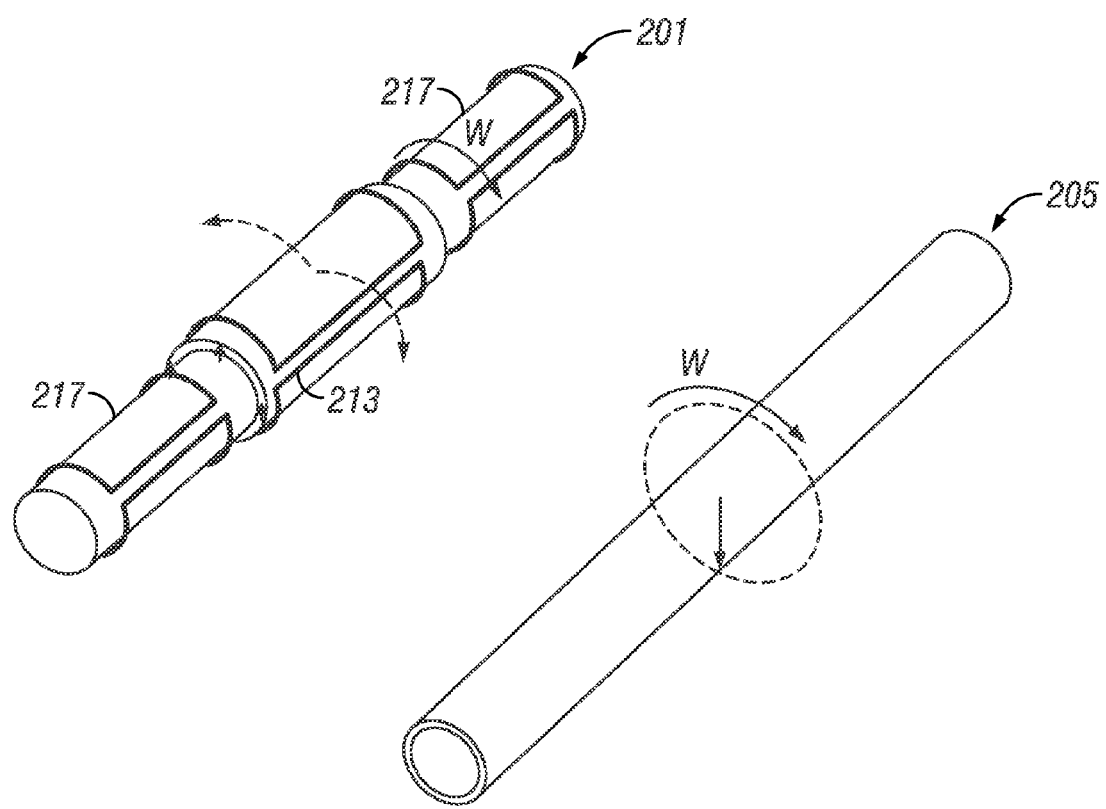
FIG. 5 shows an embodiment that utilizes a pair of additional differentially connected coils synchronously rotating with the magnetic coil.

FIG. 5 illustrates an example of embodiment of the technique that utilizes a pair of additional differentially connected coils 217 synchronously rotating with the magnet/coil assembly. The additional coil assembly is sensitive to non-parallel orientation of the wells, i.e., the output will be zero if the two boreholes are parallel. Any differential pair of identical coils placed asymmetrically with respect to the magnet will also be sensitive to the DC magnetization of the casing (gives additional proximity information) and not sensitive to the Earth's magnetic field. This is particularly useful when it is desired to drill the secondary well to intersect the pre-existing well.

An important feature of the rotational magnetometer described above is that the source of the magnetic field producing variable magnetization in the magnetic casing does not induce any direct signal in the synchronously rotating coil 213. This makes the induction method with the source and the sensor coil placed in one well feasible. Another way to eliminate the direct field signal is to use transient mode of inducing magnetization in the target casing—transient magnetometer.

Figure 6:
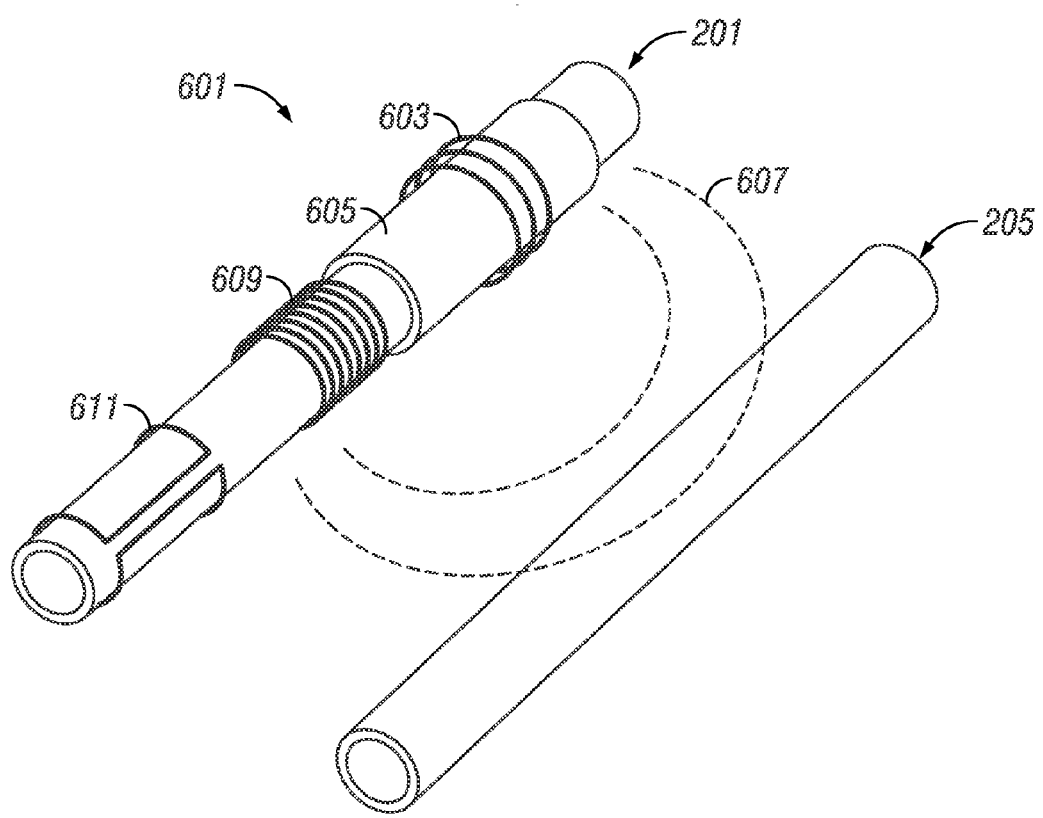
FIG. 6 shows an embodiment that utilizes switchable magnetic field source.

FIG. 6 depicts an embodiment of the transient magnetometer. The magnetometer comprises a source of switchable magnetic field 601 having a switching coil 603 and a magnetic core 605. The magnetic field source 601 generates magnetic field (the isolines of the field are shown at 607) at a position of the target casing 205. The magnetic core 605 preferably comprises a magnetic material with residual magnetization. The residual magnetization is used to provide a strong magnetic dipole without the need for a DC current driving the switching coil and causing a significant energy loss if a strong magnetic field needs to be generated (the application of the magnetic material with residual magnetization in a source of a strong switchable magnetic field is described in U.S. patent application Ser. No. 11/037,488). Disclosed therein is a magnetic core having residual magnetization. Switching the current in the coil results in magnetization reversal in the magnetic core and change in magnetic dipole moment. After the magnetization reversal is complete the current is removed and the new vector of magnetic dipole of the maintains constant (steady-state phase of the antenna dipole) due to magnetic hysteresis of magnetic material employed for the magnetic core. The magnetometer also comprises a longitudinal coil 609 to pickup a variable magnetic flux produced by the casing magnetization transient occurring in response to switching of the magnetization in the magnetic core 605. The magnetometer further comprises a transversal coil 611, the signal induced in this coil is sensitive to the azimuthal position of the casing with respect to the secondary well 201 when the drill collar rotates.

Figure 7:
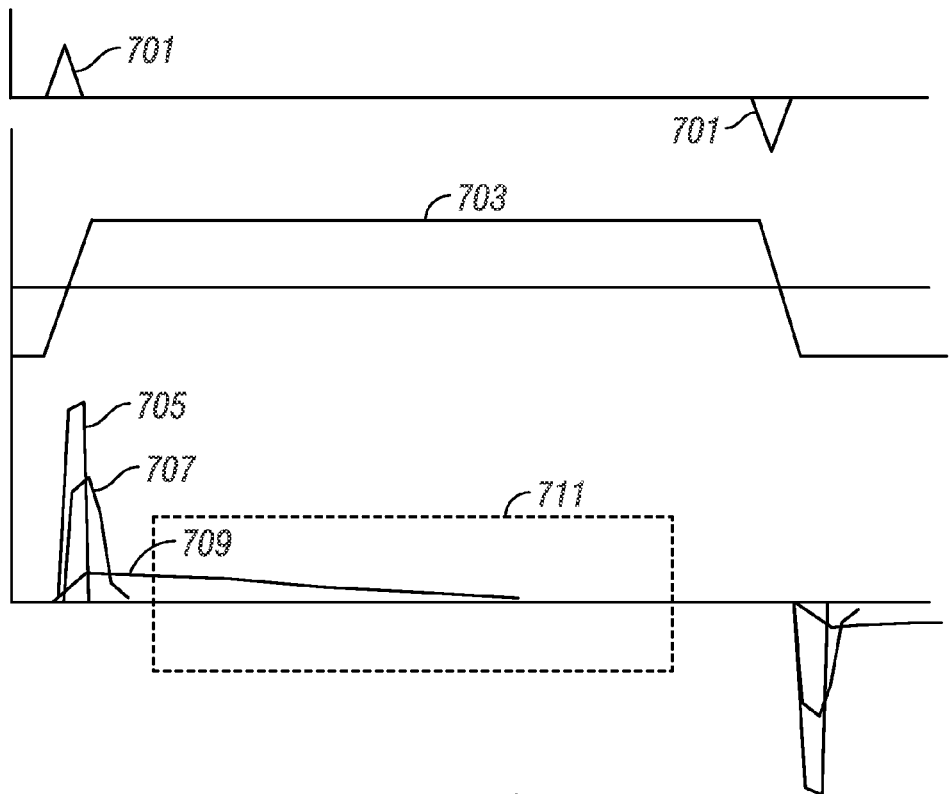
FIG. 7 shows time diagrams of the switchable magnetic field and the transient responses (corresponds to the embodiment of FIG. 6)

FIG. 7 shows time diagrams of the switchable magnetic field and the transient responses in the coil 609. The switchable magnetic field 703 is generated by switching polarity of the residual magnetization in the magnetic core 605. The switching polarity is accomplished by driving the switching coil 603 with short pulses of electric current 701.

Decaying signals 705, 707, 709 (transients) in the coil 609 are generated in response to a fast switching off or changing polarity of a "static" magnetic field. The signals are associated with direct coupling between the source and the sensing coil (transient at 705), the signal due to eddy currents in the surrounding rock formations and the conductive collar of the drill string (a conductive body) placed in the well 201 (transient at 707), and casing proximity signal due to variable magnetization of the magnetic casing 205 (transient at 709). It is important for the method that the proximity signal 709 is substantially longer than the undesired signals 705 and 707. It follows from the fact that a time constant of the transient decay is proportional to the effective magnetic permeability of a magnetic conductor. It is to be noted that unlike in the first embodiment, the direction of the magnetic field does not rotate—it only switches polarity. As the coil 609 is also longitudinal, no sinusoidal variation will occur.

The following expression for the time constant of building up of the average (over the cross-sectional area) magnetization of the casing can be used [see, for example, Polivanov, K. M. Electrodinamika veshchestvennykh sred, 1988]

$$\tau \propto \delta^2 \cdot \mu_0 \cdot \mu \cdot \sigma. \tag{10}$$

Here $\delta$ is the wall thickness of the casing, $\mu$ is the magnetic permeability, which is about 100 for a typical casing material, and $\sigma$ is the conductivity of the material of the casing. The process of building up of the magnetic flux in the coil 609 is exponential with the time constant given by eqn. (10). By the time approximately equal to the time constant of the casing magnetization process all other transients will substantially decay. Thus, by measuring the signal in a time window (at 711) starting after a time comparable with the time constant of building up of the casing magnetization (time window 711) one effectively eliminates all undesired signal. The expected time constant of the direct coupling is of the order of the duration of the pulses 701. In one embodiment, the area within the window is used as a distance indicator. Appropriate calibration is carried out. The processes due to the eddy current in the conductive surroundings are in the range 1-100 μs. The signal from the magnetic casing should last approximately 10-30 ms. Thus practical acquisition window may be positioned between 1 ms and 50 ms. Those versed in the art and having benefit of the present disclosure would recognize that it is sufficient that the magnet has a longitudinal component, and the coil is oriented so that is responsive to magnetic flux changes in the longitudinal direction.

Figure 8:
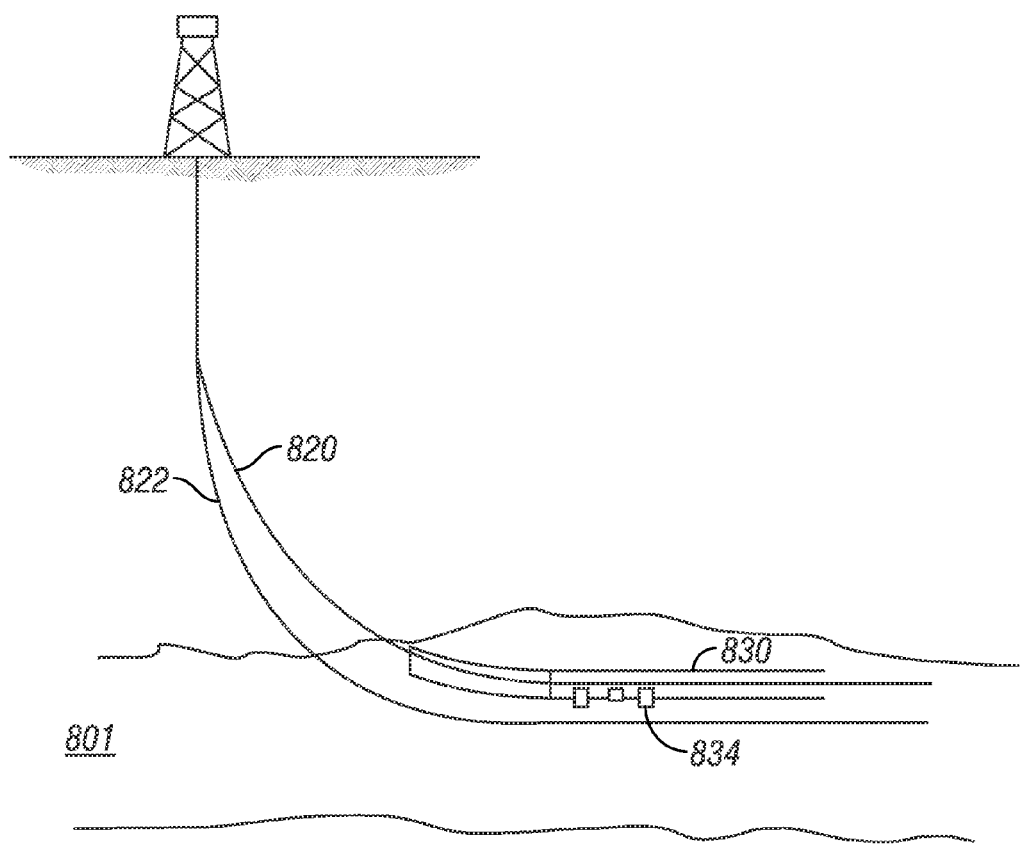
FIG. 8 shows drilling a second borehole in accurate and close proximity to a cased production borehole.

FIG. 8 illustrates an embodiment of the disclosure in secondary recovery operations. A producing wellbore 820 has been drilled into a reservoir interval 801 that contains hydrocarbons. For various reasons, such as low formation pressure or high viscosity of the hydrocarbons in the reservoir, production under natural conditions of hydrocarbons may be at uneconomically low rates. In such cases, a second wellbore 822 is drilled, typically as a side bore from the wellbore 820 so as to be substantially parallel to the main wellbore within the reservoir. The producing wellbore is typically cased with casing 830 that has perforations 834. Fluid, such as water, $CO_2$ or steam is then injected into the formation through the secondary wellbore 822 and the injected fluid drives the hydrocarbons in the formation towards the producing wellbore 820 where it may be recovered. Such an operation requires careful positioning of the secondary borehole 822 in proximity to the production wellbore 820. This may be done by monitoring the voltage in the coil. As can be seen from eqn. (7), the voltage varies inversely as the fifth power of the distance. Thus, the voltage measurements may be used as either relative distance indicators based on voltage changes, or, with proper calibration, as absolute distance indicators.

Figure 9:
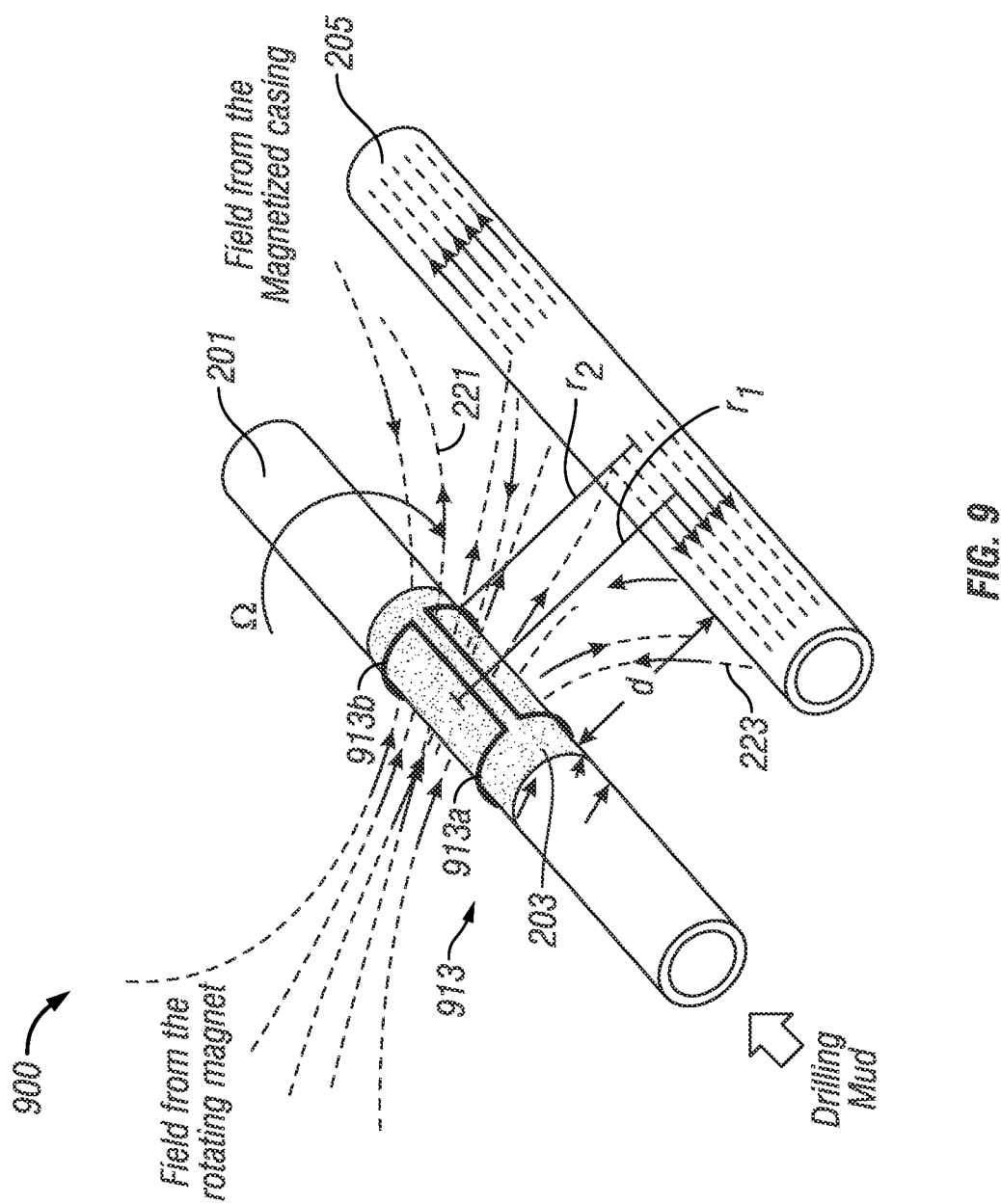
FIG. 9 shows an embodiment for a radial magnet-coil arrangement that includes two identical or substantially identical receiver coils symmetrically installed on the surface of the magnet for estimating distance between adjacent wellbore ore boreholes.

FIG. 9 shows an embodiment for a radial magnet-coil arrangement 900 that includes two identical or substantially identical receiver coils symmetrically installed on the surface of the magnet for estimating distance between adjacent wellbore or boreholes. In this embodiment 900 the coil or coil arrangement 913 includes two coils 913a and 913b that are symmetrically or substantially symmetrically co-located (installed or placed) around or about the centerline of the magnet 203 and/or drill collar 201. The radial magnetic field or flux 221 from the magnet 203 magnetizes the offset well casing 205. The magnetic flux 223 from the casing 205 is received by both coils 913a and 913b. This configuration, in aspects, may maximize the receiver signal and minimize the size of the rotational magnet/coil assembly. Such a small size magnet/coil assembly may be installed on the drill bit or just above the drill bit and below (downhole) the mud motor. In aspects, such an arrangement is more desirable than attaching the magnet/coil on the drill collar because in high stick-slip situations the rotational speed of the drill collar 201 can induce large parasitic noise. With the magnet/coil assembly on the drill bit, the magnet/coil arrangement can still be rotated at a fairly constant speed using the mud motor. Pulling the drill bit a little uphole or back can be useful because the drill bit is then not be in contact with bottom of the borehole. The configuration 900 continuously provided the distance between the drill collar 201 and the casing 205 while drilling the second borehole, which measurement may be used to monitor placement of the second borehole with respect to the first borehole.

To estimate the distance between the drill collar 201 and the casing 205 (r, from center of the drill color 201 to the center of the casing), signals from both the coils 913a and 913b are measured. Differential signals between coils 913a and 913b are obtained while rotating the drill collar 201. Due to the fact that the earth's magnetic field is spatially homogeneous while the signal from the rotating magnetization of the casing is spatially inhomogeneous, the parasitic signal from the earth's magnetic field is substantially removed from the differential signals, leaving a significant portion of signal from the rotating magnetization of the casing for further processing. A controller downhole and/or at the surface may be utilized for processing the coil signals for determining the distance between the boreholes. The controller may be a microprocessor based circuit and includes memory devices and programmed instructions for determining the distance. Such circuits are known in the art and are thus not described in detail herein. The distance from the center of the coil 913 to the center of the casing is shown as "r"$_2$ while the distance between the surfaces of the drill color and the casing is shown as "d."

Figure 10:
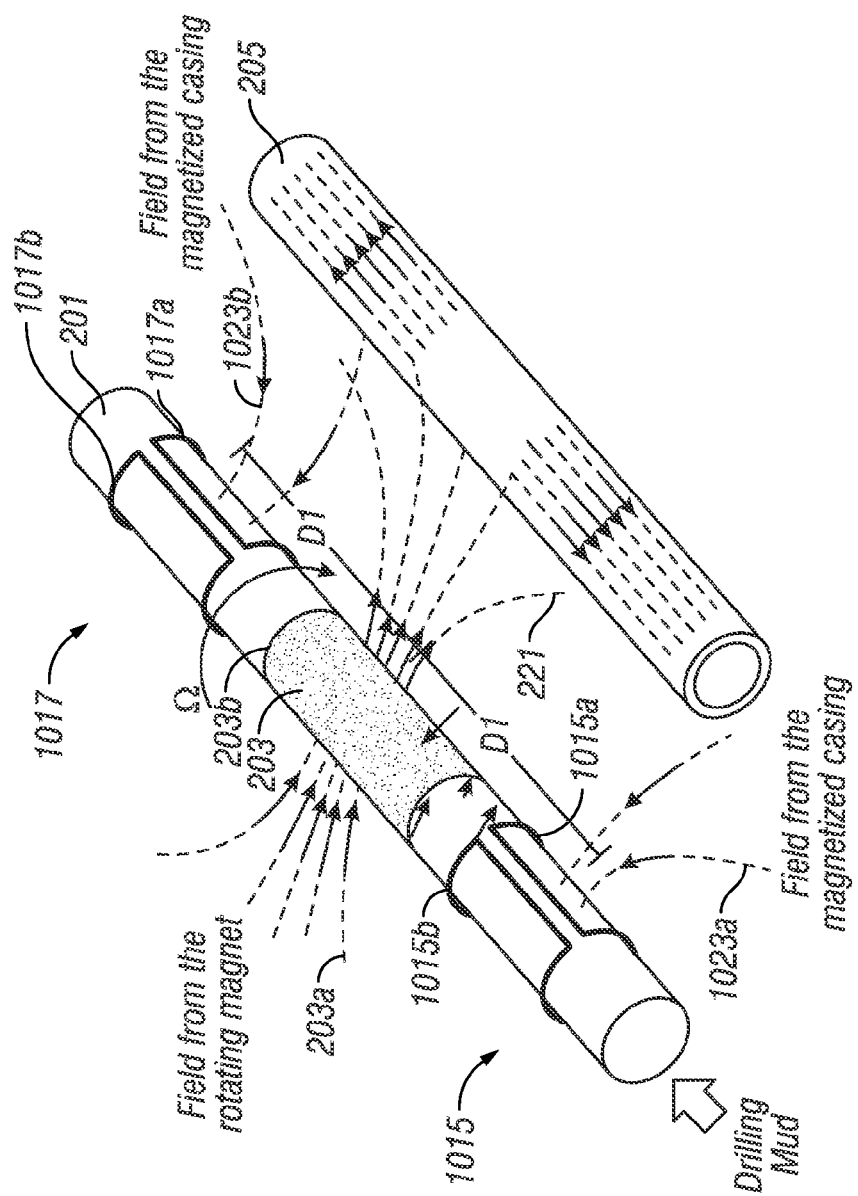
FIG. 10 shows yet another embodiment of a radial magnet-coil arrangement that includes two cols, each further containing a pair of radial oils, offset equally at two sides of the rotating magnet.

FIG. 10 shows yet another embodiment of a radial magnet-coil arrangement 1000 that includes two coils, each coil further containing a pair of coils, radially symmetrically offset at two sides of the rotating magnet 203. In the embodiment 1000, a first coil 1015 containing a first pair of identical or substantially identical coils 1015a and 1015b are placed a distance "d1" from the center of magnet 203 away from one end 203a and a second coil 1017 containing a second pair of coils 1017a and 1017b are placed at the distance d1 away from the second end 203b of magnet 203. The coils 1017a and 1017b are identical or substantially identical to coils 1015a and 1015b. Thus in the embodiment 1000, there are two pairs of radial coils, offset equally at two sides of the rotating magnet. The magnet/coil configuration 1000 provides two distance-to-casing measurements (one corresponding to each pair) whose differentials may be utilized to estimate the distances and also determine the angle of the drill collar 201 with respect to the casing 205. Therefore, this configuration may be utilized intermittently when drilling is temporarily stopped (for example when drill pipe sections are being added) to determine the angle between the drill collar 201 and the casing 205 or the inclination of the drill collar 201 relative to the casing 205. The determined angle or relative angle or the inclination may then be utilized to steer or guide the next drilling section, i.e. till the next angle or inclination measurements. When the receiver coils 1015 and 1017 are axially offset from the magnet 203, the signal in the receiver coils 1015a, 1015b, 1017a and 1017b will generally be less than signals in the receiver coils 913a and 913b because the receiver coil voltage is now dependent also on the axial offset. This means the efficiency of this configuration will decrease as the axial offset increases.

Figure 11:
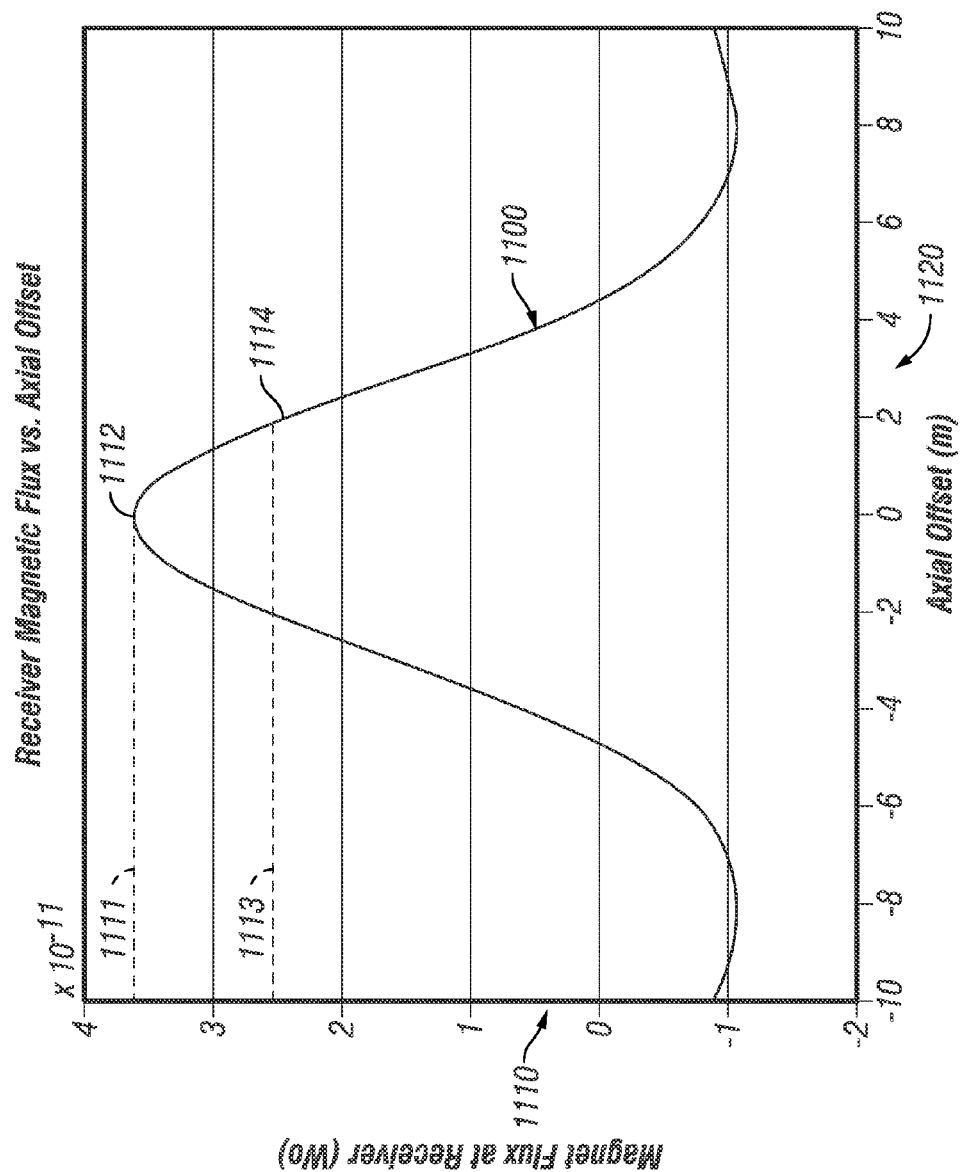
FIG. 11 depicts receiver coil magnetic flux as a function of receiver coil's axial offset as a function of distance between the coil and the casing having a five (5) meter offset.

As shown by the magnetic flux lines 221 and 223 in FIGS. 9 and 10, the magnetic field from the magnetized casing 205 is inhomogeneous not only radially from the casing 205 but also axially along the direction parallel to the casing 205. FIG. 11 shows an exemplary graph 1100 of the magnetic flux 1110 at the receiver 215 or 217 as a function of the receiver axial offset 1120, i.e. (in this case two meters) between the receiver and the rotating magnet 203 shown in FIG. 10, wherein the distance between the drill collar 201 and the casing 205 (the casing offset) is five (5) meters. For example, the receiver magnetic flux at zero axial offset 1112 is 3.60e-11 Webb, while the receiver magnetic flux at two (2) meters axial offset 1114 is 2.49e-11 Webb. Therefore, by taking differential signals between a pair of receivers at these two locations provides almost 31% of the remaining casing signal, which is significantly greater than the remaining signal (3.75%) for the radial signal.

Figure 12:
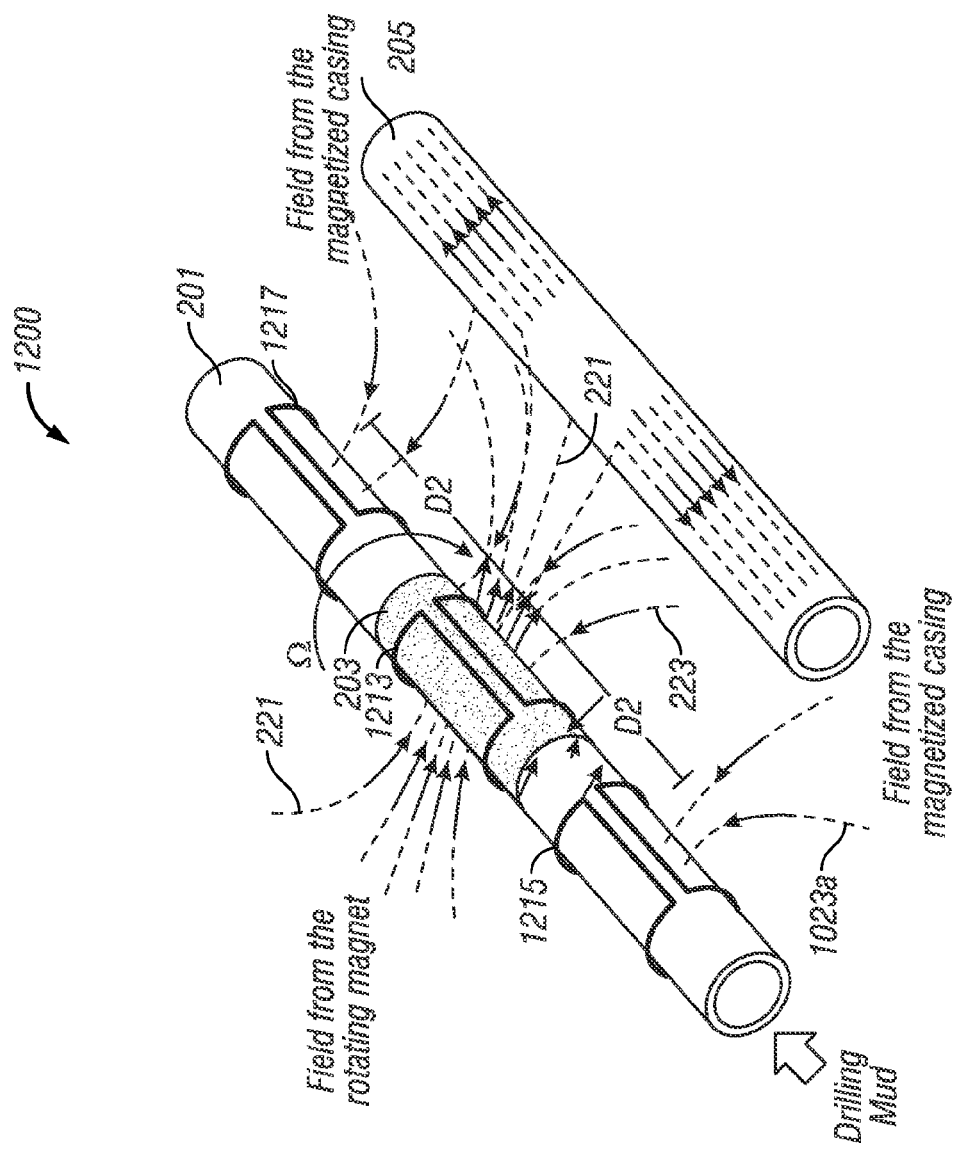
FIG. 12 shows yet another embodiment of a magnet and coils arrangement wherein that includes three receiver coils placed with equal spacing.

FIG. 12 shows an exemplary axial coil configuration 1200. In the particular configuration of FIG. 12, three identical or substantially identical receiver coils 1213, 1215 and 1217 are installed on the drill collar 201 with equal spacing d2. The middle coil 1213 is collocated with the rotating magnet 203, while coil 1215 is offset on one side of the magnet 203 and coil 1217 on the other side. Two sets of differential signals between coil pairs 1215/1213, and 1213/1217 may be generated and utilized for determining the distance as well as the relative angle between the drill collar 201 and the casing 205.

An advantage of the axial configuration 1200 of FIG. 12 is that there is no physical limitation on the axial offset between the coils, while for the radial design the offset is limited by the diameter of the drill collar so the effectiveness of the radial gradiometer cannot be made very high. A disadvantage may be that the bending/twisting/vibration of the drill collar may introduce relatively strong parasitic noise when the coils are axially separated. As a result, it may be more difficult to balance the magnetic moments of the coils for the axial configuration than for the radial configuration.

Figure 13:
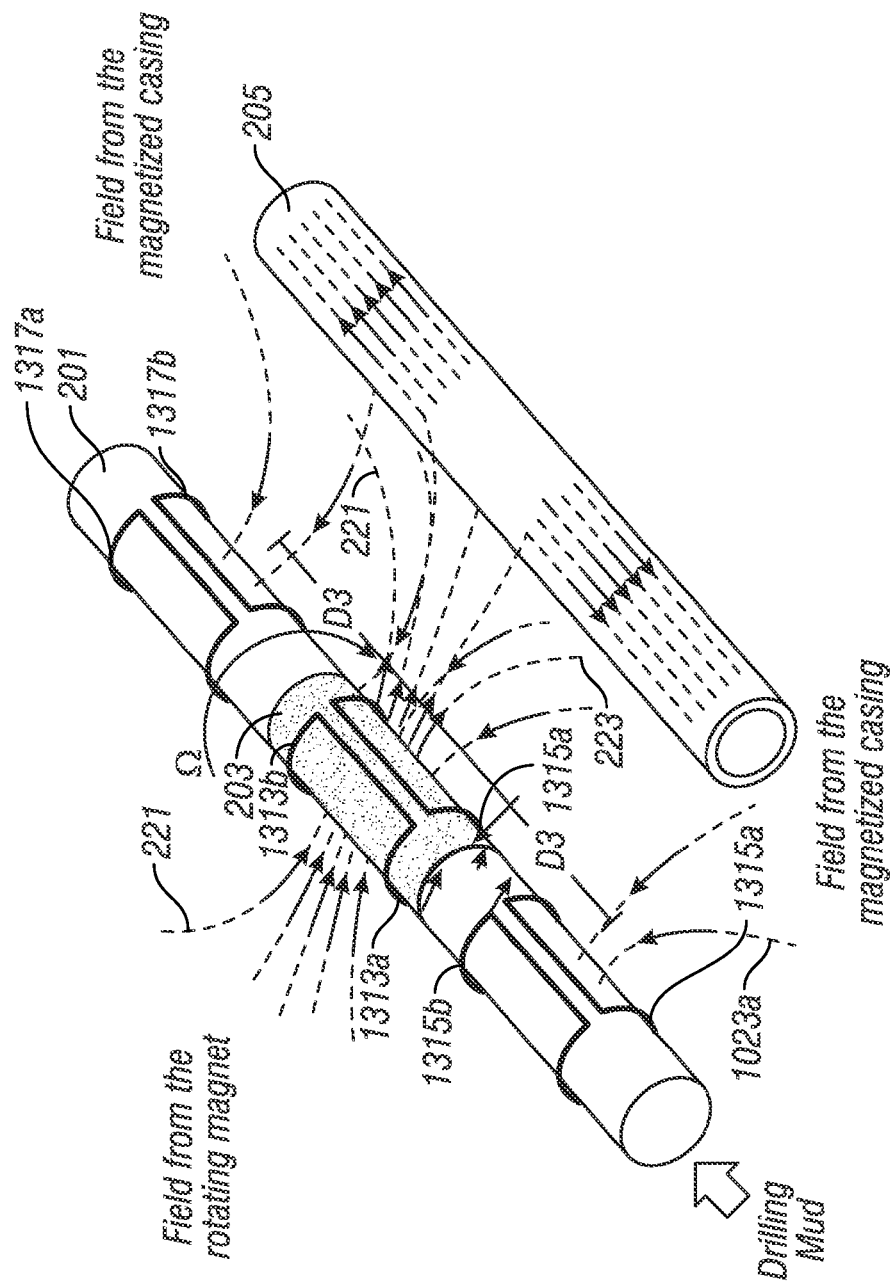
FIG. 13 shows another embodiment of a hybrid configuration of coils that includes six identical or substantially identical receiver coils forming two pairs of axial r or three pairs of radial measurements.

FIG. 13 shows an exemplary hybrid coil configuration 1300. In the particular configuration of FIG. 13, three identical or substantially identical receiver coils 1313, 1315 and 1317 are installed on the drill collar 201 with equal spacing d3. Each such coil arrangement is shown to include a pair of two identical or substantially identical coils. For example, coil 1313 includes a pair 1313a and 1313b, coil 1315 includes a pair 1315a and 1315b and coil 1317 includes a pair 1317a and 1317b. The middle coil 1313 is collocated with the rotating magnet 203, while coil 1315 is offset on one side of the magnet 203 and coil 1317 on the other side. Two sets of differential signals between coil pairs 1315/1313, and 1313/1317 may be generated and utilized for determining the distance as well as the relative angle between the drill collar 201 and the casing 205. These measurements provide measurements for both the radial and axial configurations. For example, when differential signals are obtained, coil pairs 1313a and 1313b, 1315a and 1315b and 1317a and 1317b may be viewed as three radial configurations as shown in FIG. 9. However, when signals from each pair are combined, the three coil 3113, 1315 and 1317 would function as an axial configuration as, shown in FIG. 12.

Although coils, such as coils 1015, 1017, 1313, 1315 and 1317 are shown to include two coils, more than two coils and suitable differential measurements may be utilized for the purposes of this disclosure. Also, the spacing from the magnet to the coils may be different. Additionally, the hybrid and other configurations provide more options and combinations of measurements so that the tool performance may be optimized for a particular drilling environment.

In the coil configurations shown in FIGS. 2 and 5, the rotating magnet from a second borehole produces a time varying magnetic field in a first borehole. A coil in the second borehole is then used to produce a signal responsive to a magnetic flux resulting from the magnetization of the casing from the first borehole. Since the signal induced by the rotating magnetization of the casing has a frequency which is twice the rotation frequency of the magnet/coil assembly, the measured proximity signal is separated from a parasitic signal induced in the rotating coil due to the earth's magnetic field, which has a frequency equal to the magnet/coil rotation frequency. However, in often the rotational speed of the magnet/coil assembly is not perfectly stable and therefore the parasitic signal from the earth's magnetic field may have spectral component at twice the rotation frequency of the magnet/coil assembly. Such parasitic signal cannot be removed by a frequency-domain filter and may remain as a major source of noise in the final result.

The coil configurations shown in FIGS. 9, 10, 12 and 13 may reduce the parasitic signal from the earth's magnetic field and therefore improve the signal-to-noise ratio of the measurement. In these configurations, the receiver coils with substantially equal magnetic moments are installed either radially-symmetrical or axially offset along the drill collar. The magnetic moments of the receiver coils may be stabilized at (near) identical through surface or down-hole real-time calibration. Differential signal between a pair of receivers is processed for estimating the distance and the angle between two boreholes or objects. Since the earth's magnetic field is spatially homogeneous, the parasitic signal from the earth's magnetic field in the two substantially identical receiver coils should be substantially equal and therefore cancel out. However, the signal induced by the rotating magnetization of the casing will not entirely cancel out because it is spatially inhomogeneous. Therefore, by taking the differential measurement, the noise from the earth's magnetic field is substantially removed, but a significant portion of the signal from the magnetized casing still remains for processing. The signal-to-noise ratio of the final measurement is thus improved.

An example of improvement in the signal to noise ratio is provided below. When the receiver coils are collocated with the rotating magnet, the approximate result of the receiver voltage takes the following form:

$$V_{tot}(t) = V_e \sin(\omega t) + V_c \sin(2\omega t + \phi_0), \text{ where}$$

$$V_e = \omega A_{COIL} B_e, \text{ and} \quad (11)$$

$$V_c = \frac{45\mu_0 \cdot \chi_{eff\_z} \cdot A_{CASING} \cdot A_{COIL} \cdot p_m \cdot \omega}{2048\pi \cdot r_1^{2.5} \cdot r_2^{2.5}} \quad (12)$$

Wherein:
$V_e$ is the amplitude of signal from the spatially homogeneous magnetic field of the Earth $B_e$;
$V_c$ is the amplitude of signal from the rotating magnetization of the target casing from the permanent magnet in the well being drilled, which has a strong spatial gradient;
$\phi_0$ is the angle between the Earth's magnetic field vector and the vector pointing from the well being drilled to the target casing, projected on the plane that is perpendicular to the surface of the receiver coils;
$\mu_0$ is the vacuum permeability;
$\chi_{eff\_z}$ is the effective magnetic susceptibility of the casing;
$A_{CASING}$ is the cross-sectional area of the casing;
$A_{COIL}$ is the area of the receiver coil;
$p_m$ is the magnetic moment of the rotating magnet;
$\omega$ is the angular frequency of the magnet/coil assembly;
$r_1$ is the distance between the rotating magnet and the casing;
$r_2$ is the distance between the casing and the receiver coil.
Assume that the magnet 203 is symmetric around the drill collar 201 so $r_1$ does not vary during rotation. If the distance between the center of the drill collar 201 and the casing 205 is five (5) meters, the diameter of the drill collar is 15 centimeters, then $r_2$, varies approximately in the range of 5±0.075 m as the receiver coil rotates with the drill collar. In the radial configuration, two substantially identical coils mounted on opposite sides of the drill collar in a radially symmetric manner, and signals from the two coils are differentially combined. According to Equation 12, the residual $V_c$ from the variation in $r_2$ is approximately $$\frac{2.5d}{2r_2} \sim 3.75\% \text{ of } V_c$$

from a single coil. Assume that the magnetic moments of the receiver coils are calibrated to be differed within 1%, then the amplitude of the differential $V_e$ signal from the homogeneous earth's magnetic field is now only 1% of that from a single coil. In summary, for this particular case, by using the gradi-ometer-type of measurement, the signal-to-noise ratio can be improved by a factor around 3.75. In the axial configuration, the difference in the voltages of two coils may be expressed as:

$$v(t) = V_{COIL1}(t) - V_{COIL2}(t) = \omega A_{rec}(B_C(l_1) - B_C(l_2))\sin(2\omega t + \phi_0) \quad (13)$$

Where, l is the axial offset between the magnet and the receiver coil. Equation 13 shows that the signals due to the earth's magnetic field is removed by differentiating the measurements of the two coil signals, while a significant part of the casing signal remains for processing. The signal amplitude at different axial offset l can be determined from FIG. 11 (assuming for example $r_1 = r_2 = 5$ m).

The signal-to-noise ratio may be further improved by better calibration of the receiver coil moments, and by using a drill collar with a greater diameter. It is also possible to implement an asymmetric magnet so $r_1$ varies in phase with $r_2$ during rotation, but this generally leads to a smaller total moment of the magnet and therefore a reduction of signal strength.

The processing of the data may be done by a downhole processor to give corrected measurements substantially in real time. Implicit in the control and processing of the data is the use of a computer program on a suitable machine readable medium that enables the processor to perform the control and processing. The machine readable medium may include ROMs, EPROMs, EEPROMs, Flash Memories and Optical disks.

While the foregoing disclosure is directed to the preferred embodiments of the disclosure, various modifications will be apparent to those skilled in the art. It is intended that all variations within the scope and spirit of the appended claims be embraced by the foregoing disclosure.

The invention claimed is:

1. A method of determining a distance between a first borehole and a second borehole, the method comprising:
    (a) inducing a magnetization in a magnetic object in the first borehole;
    (b) producing a first signal and a second signal each responsive to a magnetic flux resulting from the magnetization in the magnetic object respectively using a first coil and a second coil in the second borehole; and
    (c) combining the first signal and the second signal to reduce effect of earth's magnetic field from the combined signal; and
    (d) estimating the distance between the first borehole from the second borehole using the combined signal.

2. The method of claim 1, wherein inducing the magnetization comprises using a rotating magnet in the second borehole.

3. The method of claim 2, wherein the first coil and the second coil are placed radially symmetrically with respect to an axis in the second borehole.

4. The method of claim 2, wherein the first coil includes a first pair of coils placed at a first distance along the axis from the magnet and the second coil includes a second pair of coils at a second distance along the axis from the magnet.

5. The method of claim 4 further comprising determining an angle between the first borehole and the second borehole using the determined distance between the first borehole and the second borehole and locations of the first coil and the second coil.

6. The method of claim 1, wherein the first coil and the second coil are substantially identical.

7. A method of determining a distance between a first borehole and a second borehole, the method comprising:

(a) inducing a magnetization in a magnetic object in the first borehole;
(b) producing a first signal, a second signal and a third signal, each such signal responsive to a magnetic flux resulting from the magnetization in the magnetic object respectively using a first coil, second coil and third coil in the second borehole; and
(c) combining the first signal and the second signal to produce a fourth signal that is substantially free of an effect of the earth's magnetic field and combining the first signal and the third signal to produce a fifth signal that is substantially free of the effect of the earth's magnetic field,
(d) estimating the distance between the first borehole and the second borehole using the fourth signal and the fifth signal.

8. The method of claim 7 further comprising determining an inclination of the second borehole relative to the first borehole using the estimated distance between the first and second boreholes and spacing between the second coil and the third coils.

9. The method of claim 7 further comprising maintaining a desired trajectory of the second borehole during drilling of the second borehole using the estimated distance between the first borehole and the second borehole.

10. The method of claim 7, wherein inducing magnetic field comprising using a rotating magnet on a bottomhole assembly used for drilling the second borehole.

11. The method of claim 7, wherein producing the first signal, second signal and the third signal comprises using substantially identical rotating coils in the second borehole to produce the first, second and the third signals.

12. An apparatus for determining a distance between a first borehole and a second borehole, comprising:
a rotating magnet on a tool configured to be placed in the second borehole for inducing magnetization in a magnetic object in the first borehole;
a first coil and a second coil placed radially symmetrically with respect to an axis associated with the second borehole, the first coil providing a first signal and second coil providing a second signal responsive to a magnetic flux resulting from the magnetization in the magnetic object in the first borehole; and
a controller configured to combine the first signal and the second signal and determining the distance between the first borehole and the second borehole using the combined signal.

13. The apparatus of claim 12, wherein the first coil and the second coil rotate substantially synchronously about the axis.

14. The apparatus of claim 12, wherein the first coil includes a first pair of coils placed at a first distance along the axis from the magnet and the second coil includes a second pair of coils at a second distance along the axis from the magnet.

15. The apparatus of claim 12, wherein the controller is further configured to determine an angle of the second borehole relative to the first borehole using the combined signal.

16. The apparatus of claim 12, wherein the first coil and the second coil are substantially identical.

17. The apparatus of claim 12, wherein the magnet and the first and second coils are placed in a bottomhole assembly configured for use in drilling the second borehole.

18. The apparatus of claim 17 wherein the magnet and the first and the second coils are placed at a location selected from a group consisting of: on or in a drill bit; between a drill bit and a drilling motor; and uphole of a drilling motor.

19. The apparatus of claim 12, wherein the first coil and the second coil are placed radially on the magnet, the apparatus further comprising:
a third coil and a fourth coil radially placed a first distance from the magnet; and
a fifth coil and a sixth coil radially placed a second distance from the magnet; and
wherein the controller determines the distance between the first and second boreholes and an angle of the of the second borehole relative to the first borehole using signals from the first to the sixth coils.

20. A drilling assembly: comprising:
a magnet configured to induce magnetization in an spaced apart magnetic object;
at least two coils wherein at least one of the two coils includes a pair of substantially identical coils placed symmetrically on a member in the drilling assembly;
a controller configured to determine a distance between the object and the drilling assembly during a drilling operation from a difference of voltages provided by the pair of the coils responsive to the magnetization of the object.

21. The apparatus of claim 20, wherein the controller determines an associated with the drilling assembly relative to an axis of the object.

* * * * *